United States Patent [19]
Enomoto et al.

[11] Patent Number: 5,762,110
[45] Date of Patent: Jun. 9, 1998

[54] DENTS FOR REED IN HIGH-SPEED WEAVING MACHINE, AND METHOD OF MANUFACTURING SAME

[75] Inventors: Mitugu Enomoto; Hideo Shinomiya, both of Higashikurume, Japan; Yukio Miya, Kawagoe; Takanori Nanya, Sayama; Shinji Ikeda, Tokyo, all of Japan

[73] Assignee: Citizen Watch Co., Ltd., Tokyo, Japan

[21] Appl. No.: 666,273

[22] PCT Filed: Dec. 22, 1994

[86] PCT No.: PCT/JP94/02193

§ 371 Date: Sep. 10, 1996

§ 102(e) Date: Sep. 10, 1996

[87] PCT Pub. No.: WO95/17541

PCT Pub. Date: Jun. 29, 1995

[30] Foreign Application Priority Data

Dec. 22, 1993 [JP] Japan ...................... 5-325197

[51] Int. Cl.$^6$ .................. D03D 49/62; C23C 16/26; C23C 16/50
[52] U.S. Cl. .......... 139/192; 427/577; 428/216; 428/469; 428/908.8; 428/938
[58] Field of Search ............... 427/577; 29/527.1, 29/527.2; 428/216, 469, 364; 139/192

[56] References Cited

U.S. PATENT DOCUMENTS

| | | | |
|---|---|---|---|
| 4,822,662 | 4/1989 | Ishii et al. ............... | 139/192 |
| 5,275,850 | 1/1994 | Kitoh et al. ............... | 427/577 |
| 5,340,401 | 8/1994 | Cann ....................... | 427/577 |
| 5,447,181 | 9/1995 | Tahara et al. .............. | 139/192 |
| 5,511,587 | 4/1996 | Miya et al. ................ | 139/192 |

FOREIGN PATENT DOCUMENTS

| | | | |
|---|---|---|---|
| 0 550 752 | 4/1992 | European Pat. Off. ........ | 139/192 |
| 54-73964 | 6/1979 | Japan . | |
| 62-103367 | 5/1987 | Japan . | |

*Primary Examiner*—Andy Falik
*Attorney, Agent, or Firm*—Armstrong, Westerman, Hattori, McLeland & Naughton

[57] ABSTRACT

A dent (1A) for a reed for use on a high-speed weaving machine, comprises a thin flat strip (3) made of stainless steel, and a hard carbon film (2) formed on only the surface of a working ridge edge portion (3b) of the thin flat strip (3) to come into sliding contact with a yarn. The method of manufacture comprising steps of superposing a plurality of thin flat strips (3) made of a stainless steel in the same shape in a stack with the flat side surfaces (3a) of the adjacent thin flat strips (3) in close contact with each other, placing the stack of thin flat strips (3) in a film forming atmosphere with the ridge edge portions opposite the working edge portions (3b) to come in sliding contact with a yarn trued up by a dent aligning jig, and coating the working ridge edge portions (3b) of the thin flat strips (3) exposed to the film forming atmosphere with a hard carbon film (2).

5 Claims, 4 Drawing Sheets

DENTS FOR REED IN HIGH-SPEED WEAVING MACHINE, AND METHOD OF MANUFACTURING SAME

TECHNICAL FIELD

The present invention relates to dents for a reed in a high-speed weaving machine (loom) and a method of manufacturing the same and, more specifically, to a coating which enhances the durability of dents composing a reed and improves the productivity of processes for manufacturing the dents, and a method of coating such dents with the coating.

BACKGROUND TECHNOLOGY

A reed is a comblike attachment for a weaving machine, having a reed frame set with a plurality of parallel dents formed from thin metal strips and arranged at small intervals, and used to space the warp yarns evenly and to beat up filling yarns.

Generally, dents for use on a high-speed weaving machine are made of a stainless steel. The durability of dents has been a significant concern in recent years due to the progressive increase of the operating speed of weaving machines, the prevalent use of various synthetic fibers including high-strength fibers and modified cross-section fibers and various sizing materials, causing rapid abrasion of dents.

Since abraded dents cause fuzzing and yarn breakage, abraded dents must be replaced with new ones, which requires much time and labor. Therefore, the durability of dents affects significantly the operating efficiency of the weaving machine and the cost of the fabric.

The inventors of the present invention proposed previously in International Publication No. WO92/06234 improvements to enhance the durability of dents greatly by coating the entire surface of each dent or at least part of the surface of each dent including a portion that is exposed to an intensive abrasive action with a diamondlike carbon film (hereinafter referred to as "DLC film").

The DLC film is a hard amorphous carbon hydride film which is formed by, for example, a vapor-phase deposition process, such as a plasma CVD (chemical vapor deposition) process using a hydrocarbon gas, such as methane gas.

FIG. 8 shows, by way of example, a reed to be used on a high-speed weaving machine in a front view. A reed 10 has a reed frame 16 formed by securely fitting together an upper and a lower frame bar 12 and a right and a left cross bar 14, a pair of coil springs 18 extended along the upper and the lower frame bar 12, and a plurality of dents 20 fixedly held between the adjacent coils of the pair of coil springs 18 at the upper and the lower end so as to be arranged in parallel to each other at small intervals.

Dents for use on water-jet weaving machines and air-jet weaving machines include a flat type dent 20A having the shape of a simple strip, as shown in FIG. 9, and a tunnel type dent 20B having a special shape, as shown in FIG. 10.

Shaded regions a and b of these dents 20A and 20B have been considered to be the most abrading parts subject to the most intensive abrading action of yarns.

Therefore, at least the surfaces of a base strip 21 made of a stainless steel including flat regions corresponding to the regions a or b are coated with a DLC film 22 as shown in FIG. 11. An intermediate layer 23 is formed to enhance the adhesion of the DLC film 22 to the base strip 21.

It has been proved that the DLC film, i.e., a hard carbon film, coating the surface of the dent including the most abrading part improves the durability of the dent remarkably.

When forming the DLC film over the entire surface or a region of the surface including the region a of the flat type dent 20A shown in FIG. 9 or the region b of the tunnel type dent 20B shown in FIG. 10 by a vapor-phase deposition process, such as a plasma CVD process, each dent takes a wide plasma space and hence the productive efficiency of the vapor-phase deposition process is very low.

Since at least both flat regions around the part of the dent which are to be in sliding contact with yarns must be covered with the DLC film, dents must be held with a considerably big interval between the flat regions of the surfaces of the adjacent dents in a plasma space (a film forming atmosphere). When the DLC film is to be formed on only part of the flat regions of the dent, the surface of the dent other than the part of the flat regions must be covered with a mask and spacers must be interposed between the flat regions of the adjacent dents.

Such a process of forming the DLC film on dents takes much time and labor for preparation and only a batch of a small number of dents can be processed at a time for the DLC film forming process and hence the productive efficiency of the DLC film forming process is low.

SUMMARY OF THE INVENTION

The present invention has been made to solve the foregoing problems and it is therefore an object of the present invention to enhance the durability of dents remarkably by coating the dents with a hard carbon film and to enable forming a hard carbon film to be formed at a very high productivity over the necessary regions of the surfaces of the dents.

A dent in accordance with the present invention is formed by coating only the surfaces of a ridge edge portion of a thin flat strip of a stainless steel to come into sliding contact with yarns, with a hard carbon film formed by a plasma CVD process.

It was found that only a ridge edge portion of a dent comes into sliding contact with a yarn when a reed provided with dents is used on a weaving machine. Therefore, the durability of the dent can be enhanced by coating only the ridge edge portion of the dent with the hard carbon film formed by a plasma CVD process.

The term "ridge edge portion" used herein signifies a portion extending along the longitudinal ridge line of the dent and including curved or inclined surfaces extending on either side with respect to the longitudinal ridge line and may include small portions of flat side surfaces contiguous with the curved or inclined surfaces. Preferably, the hard carbon film is formed so as to cover less than 2 mm wide regions of the flat side surfaces contiguous with the ridge line on the opposite sides of the ridge line, respectively.

The substantially entire length of the ridge edge portion of a dent made of a stainless steel to come into sliding contact with yarns, excluding flat regions of the dent and the opposite longitudinal ends of the dent to be secured to the reed frame, may be coated with a hard carbon film formed by a plasma CVD process.

The opposite longitudinal ends of the dent are held between the adjacent coils of the coil springs, held on the frame members and fixed in place with an adhesive. It is preferable that the opposite longitudinal ends are not coated with a hard carbon film in view of satisfactory adhesion of the adhesive to the opposite longitudinal ends.

When the dent is a flat type dent, it is preferable to coat the surfaces of both the ridge edge portions of the dent with a hard carbon film formed by a plasma CVD process to enable the dent to be used in an inverted position.

Only the ridge edge portions of a plurality of dents, which are exposed when the dents, are stacked with the flat side surfaces in close contact with each other including portions to come into sliding contact with yarns may be coated with a hard carbon film.

Dents having a hard carbon film coating only the ridge edge portions thereof can be manufactured at a high productive efficiency by a method in accordance with the present invention.

A method of manufacturing dents for a reed for use on a high-speed weaving machine, in accordance with the present invention comprises: superposing a plurality of thin flat strips made of a stainless steel in the same shape in a stack with the flat side surfaces of the adjacent thin flat strips in close contact with each other, placing the stack of thin flat strips in a film forming atmosphere with the ridge edge portions opposite the working ridge edge portions to come in sliding contact with yarns trued up by a dent aligning jig, and coating the working ridge edge portions of the thin flat strips exposed to the film forming atmosphere with a hard carbon film.

A negative bias voltage may be applied through the dent aligning jig to the thin flat strips and the hard carbon film may be formed over the surfaces of the working ridge edge portions of the thin flat strips by a plasma CVD process.

A method of manufacturing flat type dents comprises superposing a plurality of thin flat strips of a stainless steel of the same shape in a stack with the flat sides of the adjacent thin flat strips in close contact with each other, placing the stack of thin flat strips in a film forming atmosphere with the opposite ends of the thin flat strips trued up with a dent aligning jig, and coating the longitudinal ridge edge portions of the thin flat strips on both sides of the thin strips exposed to the film forming atmosphere with a hard carbon film.

A negative bias voltage may be applied through the dent aligning jig to the thin flat strips and the hard carbon film may be formed over the surfaces of the longitudinal ridge edge portions of the thin flat strips on both the sides of the thin flat strip by a plasma CVD process.

These methods place the stack of a plurality of thin flat strips superposed with the flat portions thereof in close contact with each other in the film forming atmosphere and form the hard carbon film on the necessary portions of the thin flat strip. Accordingly, the thin flat strips need not be masked; work for interposing spacers between the adjacent thin flat strips is not necessary; and the hard carbon film can be formed on a greatly increased number of thin flat strips at a time, whereby the productive efficiency of the process can be improved greatly. It was proved that the durability of the dents of the present invention is far higher than that of the conventional dents provided with a hard carbon film coating only the front surfaces or part of the surfaces thereof.

BEST MODE FOR CARRYING OUT THE INVENTION

Preferred embodiments of the present invention will be described hereinafter with reference to the accompanying drawings.

Embodiments for Dents

Dents are classified into those of a flat type and those of a tunnel type. The middle portions of the longitudinal ridge edge portions of these dents to come into sliding contact with yarns are subject to abrasion. In a flat type dent 1A shown in FIG. 1 or a tunnel type dent 1B shown in FIG. 2, only a working ridge edge portion 2 (shaded portion), i.e., a ridge edge portion to come into sliding contact with a yarn 4 of a thin flat strip forming the dent, is coated with a hard carbon film 2 formed by a plasma CVD process.

Figure 1:
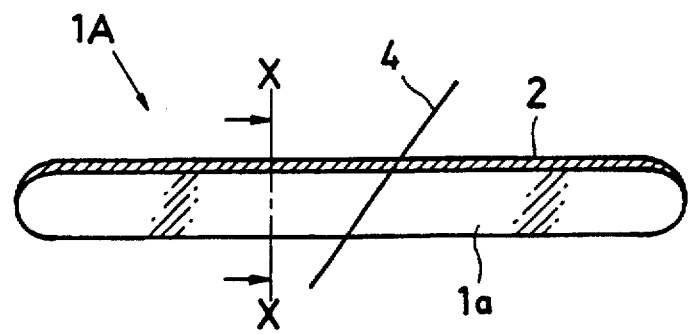
FIG. 1 is a perspective view of a flat type dent in a first embodiment according to the present invention and a yarn associated with the dent.
Figure 3:
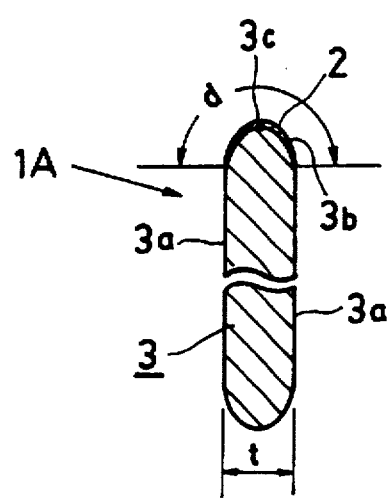
FIG. 3 is an enlarged sectional view taken on line X—X in FIG. 1.

FIG. 3 is an enlarged sectional view taken on line X—X in FIG. 1. The flat type dent 1A has an about 0.12 to about 0.5 mm thick thin flat strip 3 of a stainless steel. The surface of a longitudinal working ridge edge portion 3b, i.e., a ridge edge portion to come into sliding contact with a yarn, of the thin flat strip 3 is coated with a hard carbon film 2 having a width d along the surface of the working ridge edge portion 3b and formed both sides with respect to the longitudinal ridge line 3c of the working ridge edge portion 3b. Although the width d of the hard carbon film 2 is dependent on the shape of the working ridge edge portion 3b, preferably, the width d is not smaller than the thickness t of the thin flat strip 3 and not greater than twice the thickness $t (t \leq d \leq 2t)$.

Because it is known that the width of a range that needs improved abrasion resistance in the surface of the working ridge edge portion of a dent along the surface of the working ridge edge portion and both sides with respect to the longitudinal center line of the working ridge edge portion of a dent is not less than the thickness of the thin flat strip, at the least, and not greater than twice the thickness of the thin flat strip, at the greatest.

The surface of the working ridge edge portion 3b coated with the hard carbon film 3 includes the longitudinal ridge line 3c and a curved or inclined surface extending on either side along and on the opposite sides of the longitudinal center line 3c, and may include small portions of the flat side surfaces 3a contiguous with the curved or inclined surface. Most portions of the flat side surfaces 3a are not coated with the hard carbon film 2.

Figure 2:
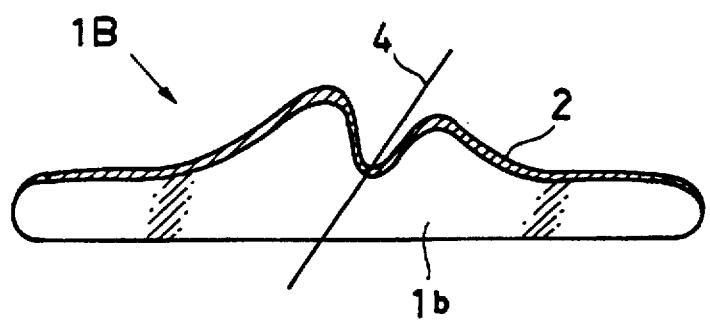
FIG. 2 is a perspective view of a tunnel type dent in a second embodiment according to the present invention and a yarn associated with the dent.
Figure 8:
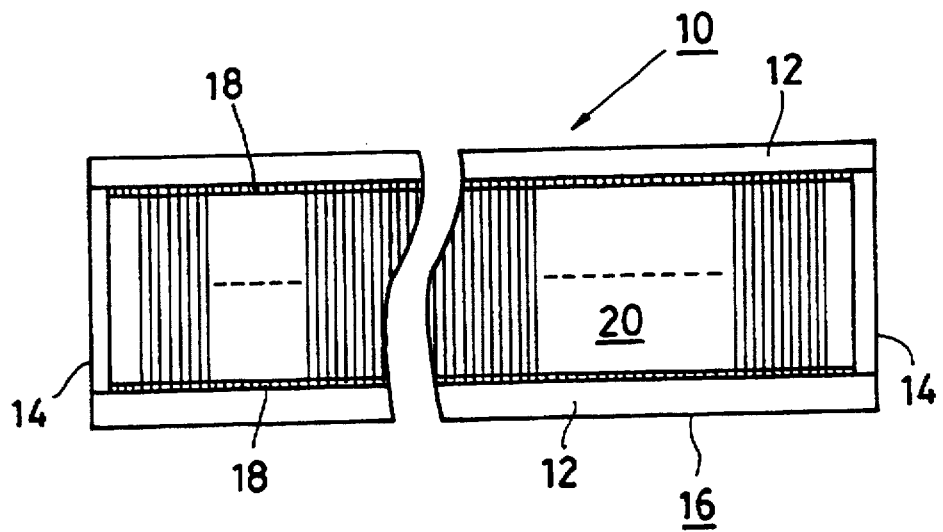
FIG. 8 is a front view of an example of a reed for use on a high-speed weaving machine.

Although the entire length of the working ridge edge portion of a dent may be coated with a hard carbon film 2 formed by a plasma CVD process like the working ridge edge portions 3b of the dents 1A and 1B embodying the present invention which are coated with the hard carbon film 2 as shown in FIGS. 1 and 2, it is desirable that the opposite ends of the dent are not coated with the hard carbon film, because the dent can be firmly secured to the frame members 12 of the reed frame 16 at its opposite ends by the coil springs 18 and an adhesive, as shown in FIG. 8, when the opposite ends are not coated with the hard carbon film 2.

Figure 4:
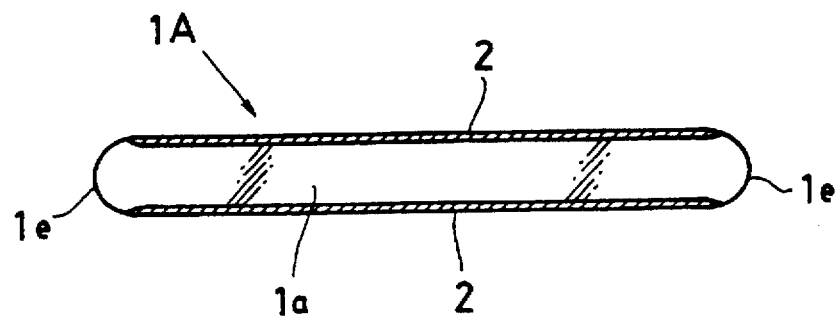
FIG. 4 is a plan view of a flat type dent in a third embodiment according to the present invention.

It is preferable to coat both the longitudinal ridge edges of the flat type dent 1A of a stainless steel excluding the end portions 1e of the same with a hard carbon film 2 formed by a plasma CVD process as shown in FIG. 4. When one of the longitudinal ridge edge portions used as working edge is abraded by a yarn, the flat type dent 1A is inverted to use the other longitudinal edge portion as working ridge edge, so that the effective service life of the flat type dent 1A can be extended.

Thus, only the surface of the ridge edge portion of the dent 1A or 1B embodying the present invention including portions of the surface to come into contact with a yarn and exposed when a plurality of the dents 1A or 1B are superposed in a stack in close contact with each other is coated with the hard carbon film 2.

Method of Manufacturing Dents

A method of manufacturing dents in accordance with the present invention, embodying the present invention will be described hereinafter.

Figure 5:
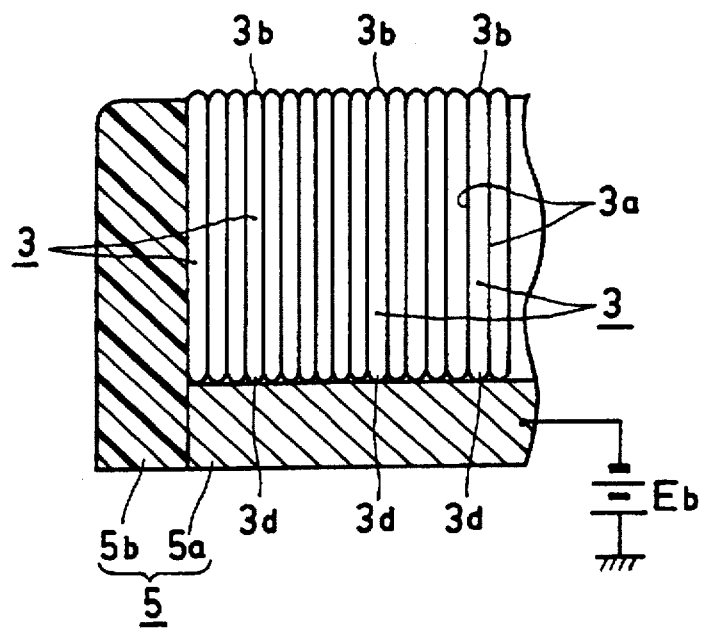
FIG. 5 is an enlarged fragmentary sectional view of a dent aligning jig to be employed in a method of manufacturing dents, embodying the present invention with some thin flat strips set on the dent aligning jig.

As shown in FIG. 5, a plurality of thin flat strips 3 made of a stainless steel in the same shape are superposed in a stack with the flat side surfaces 3a thereof in close contact with each other, the stack of the thin flat strips 3 is held on a dent aligning jig 5 with the ridge edge portions 3d not coming into sliding contact with yarns trued up by the dent aligning jig 5, and the dent aligning jig 5 thus holding the thin flat strips 3 is placed in a film forming vacuum device, not shown.

The dent aligning jig 5 has a conductive member 5a in contact with the ridge edge portions 3d of the thin flat strips 3, and insulating end members 5b in close contact with the flat side surfaces 3a of the thin flat strips 3 at the opposite ends of the stack, respectively. Under certain conditions including those of the shape of the thin flat strips 3 and the number of the thin flat strips 3 in the stack, it is preferable to use conductive end members instead of the insulating end members 5b.

After evacuating the vacuum device to a predetermined vacuum, the surfaces of the working ridge edge portions 3b of the thin flat strips 3 coming into contact with yarns are bombarded, and a hard carbon film is deposited on the surfaces of the working ridge edge portions Eb by a DC plasma CVD process while applying a negative bias voltage 3b through the conductive member 5a of the dent aligning jig 5 to the thin flat strips 3.

The opposite ends of the thin flat strips 3 may be covered with the dent aligning jig 5 to obtain dents having opposite ends not coated with the hard carbon film.

In this embodiment, process conditions for bombardment and hard carbon film deposition are as follows.

Bombardment
 Gas: Ar gas
 Vacuum: 3×10$^{-3}$ torr
 DC voltage: −5 kV
 Duration: 5 min
Hard Carbon Film Deposition
 Gas: Benzene gas
 Vacuum: 5×10$^{-3}$ torr
 DC voltage: −3 kV
 Film thickness (ridge edge portion): 1 μm Hard carbon film 2 is formed on the surfaces of the ridge edge portions of the flat type dent 1A and the tunnel type dent 1B, as shown in FIGS. 1 and 2, under the foregoing process conditions.

Figure 9:
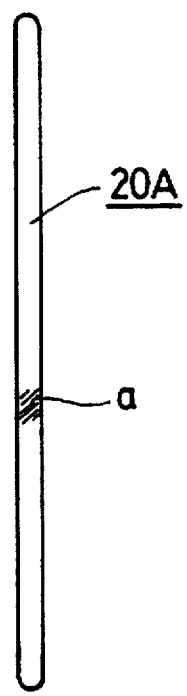
FIGS. 9 and 10 are plan views of a flat type dent and a tunnel type dent for composing reeds like that shown in FIG. 8.
Figure 10:
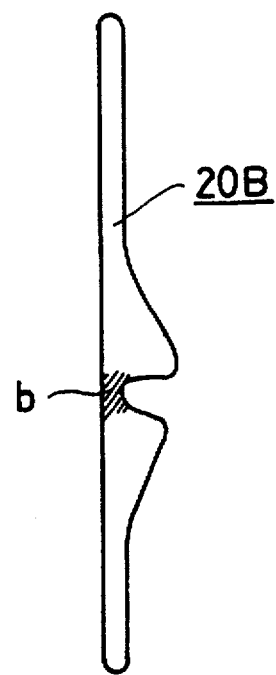
Figure 11:
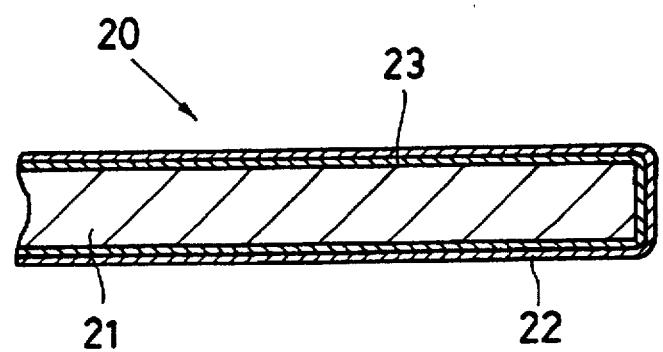
FIG. 11 is an enlarged fragmentary sectional view of a dent coated with a DLC film previously proposed by the inventors of the present invention.

Dents in Example 1 made by the method in this embodiment and provided with the hard carbon film only on the working ridge edge portions, dents in comparative example 1 provided with the hard carbon film over the entire surfaces thereof, and dents in comparative example 2 provided with the hard carbon film only on portions of the surfaces thereof including regions corresponding to a region a shown in FIG. 9 or the region b shown in FIG. 10 were compared in film deposition rate as measured at a central portion of the ridge edge portion, in productive efficiency of the process (the number of dents processed) and in durability. Results of comparison are tabulated in the following table.

|  | Comp. ex. 1 | Comp. ex. 2 | Ex. 1 |
| --- | --- | --- | --- |
| Deposition rate | 10 | 12 | 8 |
| Productive eff. | 10 | 10 | 200 |
| Durability | 150 (H.) | 250 (H.) | 500 (H.) |

As is obvious from the table, the number of dents in a batch processed by the method in this embodiment is twenty times that of dents in batches processed by the conventional methods, and the durability expressed by service life (H-hours) of the dents in Example 1 is far longer than those of comparative examples 1 and 2. Although deposition rate in forming the hard carbon film by the method in this embodiment is slightly lower than those of comparative examples 1 and 2, because the batch size of Example 1 is as large as twenty times that of comparative examples 1 and 2, the hard carbon film deposition process is only one of the processes necessary for forming the hard carbon film on the thin flat strips and work for placing spacers between the thin flat strips and removing the spacers, and work for putting a mask on and removing the same from the thin flat strips are not necessary. Therefore, the total process time of the method in this embodiment is far shorter than those necessary for comparative examples 1 and 2.

Although the causes of the durability of the dents made by the method in this embodiment being far more excellent than that of the dents having flat surfaces coated with the hard carbon film are indefinite, it is inferred that the excellent durability of the dents made by the method in this embodiment is attributable to the production of an undisturbed plasma in spaces between the adjacent thin flat strips and resulting stable deposition of a firm hard carbon film.

Figure 6:
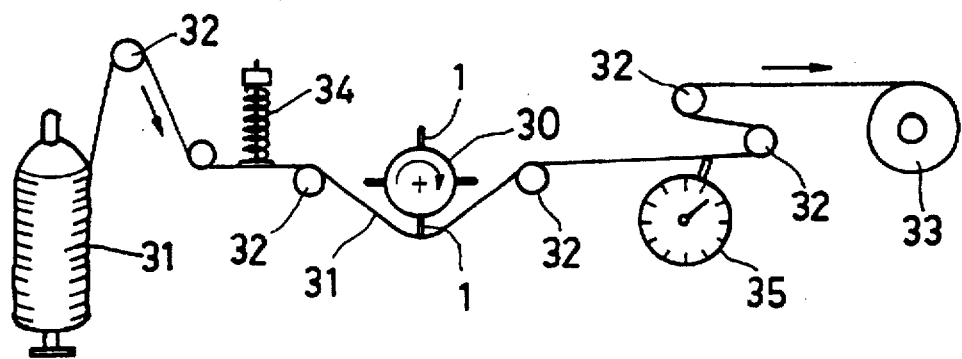
FIG. 6 is a typical view for assistance in explaining a method of durability test for testing the durability of dents to abrasion by yarns.

A method of durability test will be described hereinafter. FIG. 6 is a typical view for assistance in explaining a method of durability test for testing the abrasion resistance of dents when rubbed frictionally by a yarn.

Four sample dents 1 are attached to the circumference of a sample holding roller 30 at angular intervals of 90° so as to extend along the axis of the sample holding roller 30 and to project radially from the same. A yarn 31 pulled out from a yarn package is extended through guide rollers 32 so as to extend in a region in which the test dents 1 are turned. The yarn 31 is taken up on a winding reel 33. The yarn 31 is tensioned at 30g by a tension spring 34, the tension of the yarn 31 is measured by a tension meter 35 and the condition of the yarn 31 is regulated to maintain the fixed tension.

The yarn 31 is a 50 denier 24-filament polyester filament yarn. The winding reel 33 is rotated at 200 rpm and the dent holding roller 30 is rotated at 1000 rpm.

The dent holding roller 30 and the winding reel 33 are stopped periodically to stop the yarn 31, and the sample dents 1 are inspected for abrasion grooves. The inspection is repeated periodically to measure time for which the sample dents 1 are abraded by the yarn 31 before abrasion grooves are formed in the sample dents 1.

Times in hours (H.) thus measured are tabulated in the table shown above. The times for which dents entirely coated with a chromium film by chromium plating and stainless dents not coated with any film before abrasion grooves were formed about 30 H. and about 10 H., respectively.

Incidentally, only the surfaces of both the longitudinal ridge edge portions of the flat-type dent 1A can be coated with a hard carbon film as shown in FIG. 4 by the following processes.

Figure 7:
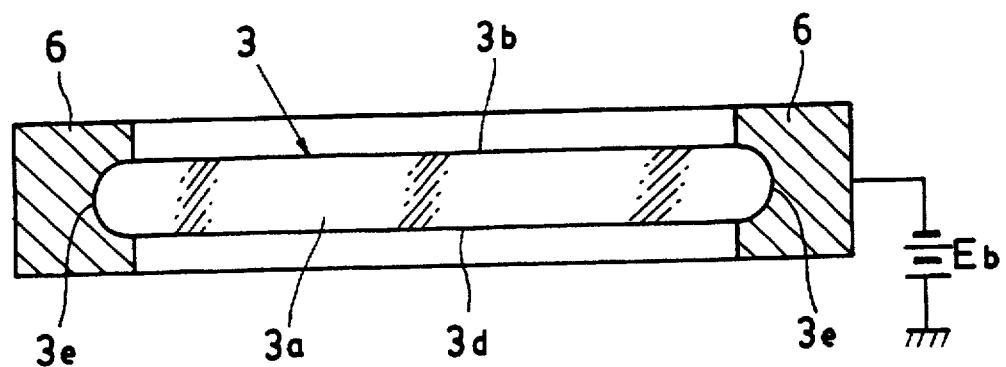
FIG. 7 is a sectional view of dent aligning jig to be employed in a method of manufacturing flat type dents, embodying the present invention, in a state holding dents at their opposite ends.

Referring to FIG. 7, a plurality of thin flat strips 3 made of a stainless steel in the same shape are superposed in a stack in a direction perpendicular to the sheet with the flat side surfaces 3a thereof in close contact with each other. The stack of the thin flat strips 3 is held on a dent aligning jig 6 with the opposite longitudinal ends 3e of the thin flat strips 3 in contact with the conductive members of the dent aligning jig 6. The dent aligning jig 6 holding the stack of the thin flat strips 3 is placed in a film forming atmosphere produced in a vacuum device, a negative bias voltage Eb is applied through the dent aligning jig 6 to the thin flat strips 3, and a hard carbon film is deposited on the surfaces of the longitudinal ridge edge portions 3b, 3d of the thin flat strips 3 exposed to the film forming atmosphere by a DC plasma CVD process.

Conditions for bombardment and film formation in this embodiment may be the same as those in the foregoing embodiment.

Although the foregoing embodiments form the hard carbon film directly on the surface of the ridge edge portion of the dent, an intermediate layer may be formed between the surface of the edge portion of the dent and the hard carbon film to enhance the adhesion of the hard carbon film to the surface of the ridge edge portion of the dent.

The intermediate layer may be a composite intermediate layer consisting of a chromium (Cr) or titanium (Ti) and a silicon layer, a carburized layer formed by carburizing the surface layer of the thin flat strip or a layer of a carbide of a metal of the group IVa or Va. The most effective intermediate layer is a titanium carbide film having an excessive carbon content.

The hard carbon film was formed by the DC plasma CVD process, but it is not limited to this process and may be formed by other plasma CVD processes such as an RF (radio-frequency) plasma CVD process. Naturally, the process gas may be any suitable one of various hydrocarbon gases.

As is apparent from the foregoing description, the dents in accordance with the present invention each have a working ridge edge portion to come into sliding contact with a yarn when set on a reed frame and used on a weaving machine, coated fly with the hard carbon film formed by a plasma CVD process and greatly improved durability to abrasion by a yarn. Since the flat side surfaces of the dents are scarcely coated with the hard carbon film, a wasteful cost for forming unnecessary hard carbon film can be saved, the dimensions of the dents and the inherent characteristics of the thin flat strip including toughness are scarcely changed and hence the dents can be designed by the conventional method.

The dents in accordance with the present invention can be manufactured at a high productive efficiency and at low manufacturing costs by the method in accordance with the present invention, which does not need any spacers to be interposed between the adjacent thin flat strips to space apart the thin flat strips, nor any mask for covering the thin flat strips when forming the hard carbon film on the surfaces of the ridge edge portions of the thin flat strips, and is capable of forming the hard carbon film by a plasma CVD process only on the surfaces of the working ridge edge portions of the plurality of thin flat strips superposed in a stack with the flat side surfaces of the adjacent thin flat strips in close contact with each other. Accordingly, working efficiency is improved remarkably and the number of thin plates that can be processed in the plasma space in a batch is far greater than that of thin plates processed by the conventional method to form conventional dents.

What is claimed is:

1. A method of manufacturing dents for a reed for use on a high-speed weaving machine, comprising steps of:

superposing a plurality of thin flat strips made of a stainless steel in the same shape having ridge edge portions and working ridge edge portions in a stack with the flat side surfaces of the adjacent thin flat strips in close contact with each other;

placing the stack of thin flat strips in a film forming atmosphere with the ridge edge portions opposite the yarn-contacting working ridge edge portions trued up by a dent aligning jig; and coating the working ridge edge portions of the thin flat strips exposed to the film forming atmosphere with a hard carbon film by a plasma CVD process.

2. The method of manufacturing dents for a reed for use on a high-speed weaving machine, according to claim 1, further comprising applying a negative bias voltage through the dent aligning jig to the thin flat strips when forming the hard carbon film on surfaces of the working ridge edge portions of the thin flat strips to come into sliding contact with a yarn by a plasma CVD process.

3. A method of manufacturing dents for a reed for use on a high-speed weaving machine, comprising steps of:

superposing a plurality of thin flat strips made of a stainless steel in the same shape in a stack with the flat side surfaces of the adjacent thin flat strips in close contact with each other;

placing the stack of thin flat strips in a film forming atmosphere with opposite longitudinal ends of the thin flat strips trued up by a dent aligning jig; and coating both ridge edge portions of the thin flat strips exposed to the film forming atmosphere with a hard carbon film by a plasma CVD process.

4. The method of manufacturing dents for a reed for use on a high-speed weaving machine, according to claim 3, further comprising applying a negative bias voltage through the dent aligning jig to the thin flat strips when forming the hard carbon film on surfaces of the longitudinal ridge edge portions of the thin flat strips by a plasma CVD process.

5. A dent for a reed for use on a high-speed weaving machine made by the method of claims 1 or 3.

* * * * *